US012785028B2

(12) United States Patent
Chaney et al.

(10) Patent No.: US 12,785,028 B2
(45) Date of Patent: Nov. 3, 2026

(54) ION IMPLANTER ION SOURCE COUNTER EROSION ENDPLATE

(71) Applicant: Applied Materials, Inc., Santa Clara, CA (US)

(72) Inventors: Craig R. Chaney, Gloucester, MA (US); Adam M. McLaughlin, Merrimac, MA (US)

(73) Assignee: Applied Materials, Inc., Santa Clara, CA (US)

( * ) Notice: Subject to any disclaimer, the term of this patent is extended or adjusted under 35 U.S.C. 154(b) by 294 days.

(21) Appl. No.: 18/769,015

(22) Filed: Jul. 10, 2024

(65) Prior Publication Data

US 2026/0018368 A1 Jan. 15, 2026

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01)

(58) Field of Classification Search
CPC .............................. H01J 37/08; H01J 37/3171
See application file for complete search history.

(56) References Cited

U.S. PATENT DOCUMENTS 6,515,408 B1 * 2/2003 England ................ H01J 37/026 313/231.01
9,514,909 B2 * 12/2016 Nishida ................... H01T 19/04
11,251,010 B1 2/2022 Perel et al.
2010/0252746 A1 10/2010 Sinclair et al.
2017/0221669 A1 8/2017 Chaney et al.
2022/0080504 A1 3/2022 Abeshaus et al.
2022/0199351 A1 6/2022 Yen et al.
2023/0187165 A1 6/2023 Kim et al.
2023/0260745 A1 8/2023 Patel et al.

FOREIGN PATENT DOCUMENTS

KR 2024-0036080 A 3/2024
TW 201103065 A 1/2011

OTHER PUBLICATIONS

International Search Report and Written Opinion mailed Oct. 2, 2025 in corresponding PCT application No. PCT/US2025/032154.

* cited by examiner

*Primary Examiner* — Sean Luck
(74) *Attorney, Agent, or Firm* — Nields, Lemack & Frame, LLC

(57) ABSTRACT

An ion source that includes a cathode near a first end plate and a non-planar second end plate is disclosed. The non-planar second end plate serves to counteract the effect of the plasma on the second end plate. In some embodiments, the plasma has the ability to erode the second end plate. Rather than making the entire second end plate thicker, the second end plate is only made thicker in the regions that are affected by the plasma. In this way, less material is used in the production of the second end plate, and increased lifetime is achieved. This concept may also be used in environments where the plasma serves to deposit material on the second end plate.

19 Claims, 6 Drawing Sheets

ION IMPLANTER ION SOURCE COUNTER EROSION ENDPLATE

FIELD

Embodiments of the present disclosure relate to ion sources and implantation systems wherein an interior surface of the end plate of the ion source is non-planar to compensate for the effects of the ionization.

BACKGROUND

The fabrication of a semiconductor device involves a plurality of discrete and complex processes. These processes may be performed using a workpiece processing system. This workpiece processing system may be a beam-line ion implantation system or a plasma processing chamber, for example. In certain embodiments, the temperatures of the components in the workpiece processing system are highly relevant to the process being performed.

In operation, a feed gas may be ionized in an ion source and extracted through an extraction aperture disposed on an extraction plate. In certain embodiments, the ion source may be an indirectly heated cathode (IHC) ion source that includes an indirectly heated cathode disposed within the arc chamber near the first end plate. In some embodiments, a repeller is disposed near the opposite second end plate to repel electrons back toward the center of the arc chamber.

However, in certain embodiments, a repeller may not be included in the arc chamber. In addition to repelling electrons, the repeller also serves to protect the second end plate from damage or deposition caused by these electrons.

Thus, in certain embodiments, it may be beneficial to modify the design of the second end plate in embodiments where the IHC ion source does not include a repeller.

SUMMARY

An ion source that includes a cathode near a first end plate and a non-planar second end plate is disclosed. The non-planar second end plate serves to counteract the effect of the plasma on the second end plate. In some embodiments, the plasma has the ability to erode the second end plate. Rather than making the entire second end plate thicker, the second end plate is only made thicker in the regions that are affected by the plasma. In this way, less material is used in the production of the second end plate, and increased lifetime is achieved. This concept may also be used in environments where the plasma serves to deposit material on the second end plate.

According to one embodiment, an ion source is disclosed. The ion source comprises an arc chamber having a first end plate, a second end plate and side walls connecting the first end plate and the second end plate; a cathode disposed within the arc chamber near the first end plate; and an extraction plate disposed on the arc chamber, wherein a repeller is not disposed within the arc chamber and the second end plate comprises an inward facing protrusion. In some embodiments, the arc chamber comprises one or more side electrodes, disposed near the side walls. In some embodiments, the inward facing protrusion is aligned with the cathode. In some embodiments, the inward facing protrusion has a cylindrical shape. In some embodiments, the inward facing protrusion comprises a rectangular prism. In some embodiments, the inward facing protrusion comprises a face and sidewalls. In certain embodiments, the face of the inward facing protrusion is flat, concave or convex. In certain embodiments, the sidewalls are perpendicular to an inner surface of the second end plate.

According to another embodiment, an ion source is disclosed. The ion source comprises an arc chamber having a first end plate, a second end plate and side walls connecting the first end plate and the second end plate; a cathode disposed within the arc chamber near the first end plate; and an extraction plate disposed on the arc chamber, wherein a repeller is not disposed within the arc chamber and the second end plate comprises an inward facing indentation. In some embodiments, the arc chamber comprises one or more side electrodes, disposed near the side walls. In some embodiments, the inward facing indentation is aligned with the cathode. In some embodiments, the inward facing indentation has a cylindrical shape. In some embodiments, the inward facing indentation is oval. In some embodiments, the inward facing indentation is rectangular. In some embodiments, the inward facing indentation has a face and sidewalls. In certain embodiments, the face of the inward facing indentation is flat, concave or convex. In certain embodiments, the sidewalls are perpendicular to an inner surface of the second end plate.

According to another embodiment, an ion implantation system is disclosed. The ion implantation system comprises any of the ion sources described above to generate an ion beam; a workpiece holder; and one or more beam line components to direct the ion beam toward the workpiece holder.

BRIEF DESCRIPTION OF THE FIGURES

For a better understanding of the present disclosure, reference is made to the accompanying drawings, which are incorporated herein by reference and in which.

DETAILED DESCRIPTION

As noted above, in IHC ion sources that lack a repeller, the second end plate may be affected by the plasma within the arc chamber 200. To counteract these effects, a non-planar second end plate may be used.

Figure 1A:
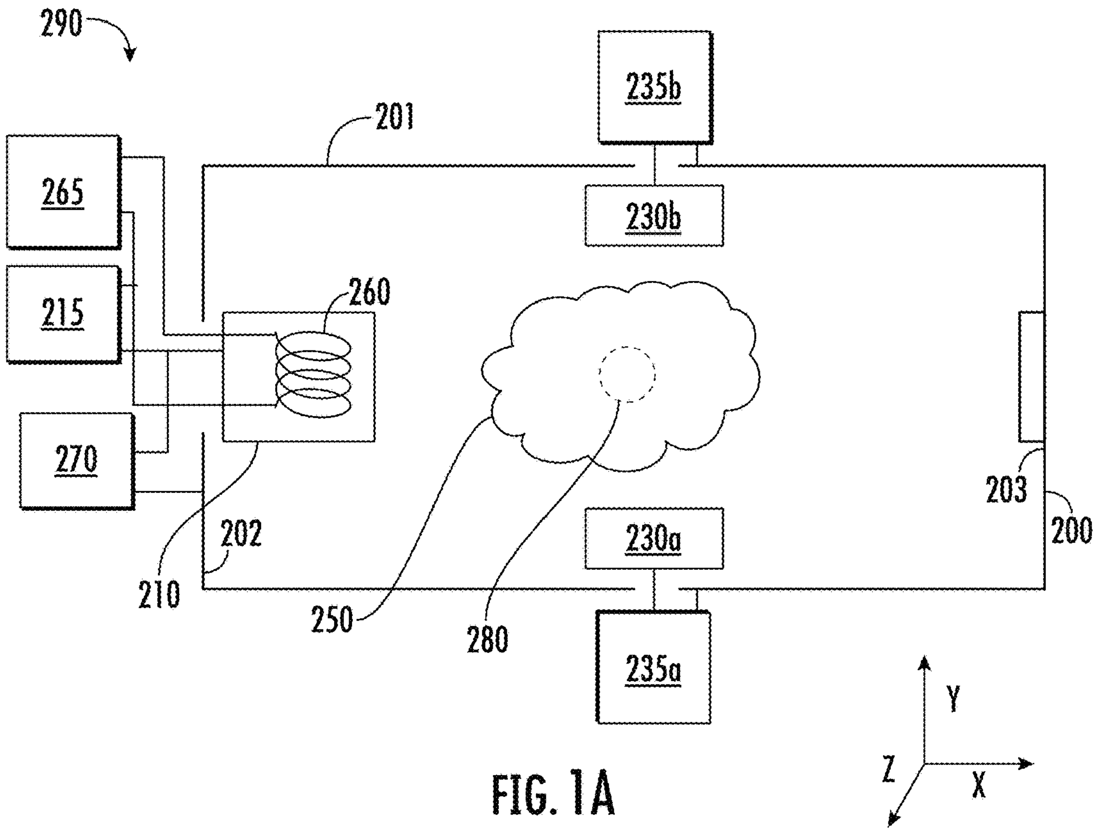
FIGS. 1A-1B shows an indirectly heated cathode ion source according to two embodiments that may utilize the non-planar second end plate described herein.

FIG. 1A shows a first embodiment of an ion source using an indirectly heated cathode that may utilize the disclosed second end plate. The ion source 290 includes an arc chamber 200, comprising a first end plate 202, a second end plate 203, which has an interior surface which is non-planar, and side walls 201 connecting to these two end plates. The arc chamber 200 also includes a bottom wall and an extraction plate. The walls of the arc chamber 200 may be constructed of an electrically conductive material, such as tungsten, and may be in electrical communication with one another. Note that the arc chamber 200 may be formed using two discrete ends, side walls 201 and a bottom wall. Alternatively, the arc chamber may be a unitary piece having the recited components. In some embodiments, the ion source 290 is an indirectly heated cathode (IHC) ion source. A cathode 210 is disposed in the arc chamber 200 near the first end plate 202 of the arc chamber 200. A filament 260 is disposed behind the cathode 210. The filament 260 is in communication with a filament power supply 265. The filament power supply 265 is configured to pass a current through the filament 260, such that the filament 260 emits thermionic electrons. Cathode bias power supply 215 biases filament 260 negatively relative to the cathode 210, so these thermionic electrons are accelerated from the filament 260 toward the cathode 210 and heat the cathode 210 when they strike the back surface of cathode 210. The cathode bias power supply 215 may bias the filament 260 so that it has a voltage that is between, for example, 200V to 1500V more negative than the voltage of the cathode 210. The cathode 210 then emits thermionic electrons on its front surface into the arc chamber 200.

Thus, the filament power supply 265 supplies a current to the filament 260. The cathode bias power supply 215 biases the filament 260 so that it is more negative than the cathode 210, so that electrons are attracted toward the cathode 210 from the filament 260. Additionally, the cathode 210 is electrically biased relative to the arc chamber 200, using cathode power supply 270.

In this embodiment, there is no repeller located near the second end plate 203 of the arc chamber 200. Thus, the second end plate 203 may be solid, which denotes that there are no openings that pass through the second end plate, which are traditionally present when a repeller is used. Rather, one or two side electrodes 230*a*, 230*b* may be employed. In some embodiments, each side electrode 230*a*, 230*b* is in communication with a respective electrode power supply 235*a*, 235*b*. In other embodiments, one of the side electrodes may be grounded or electrically floating, and one of the electrode power supplies may be eliminated. In other embodiments, only one side electrode may be used.

In operation, a gas is supplied to the arc chamber 200. The thermionic electrons emitted from the cathode 210 cause the gas to form a plasma 250. The side electrodes 230*a*, 230*b* create an electrical field within the arc chamber 200. Ions from this plasma 250 are then extracted through an extraction aperture 280 in the extraction plate. The ions are then manipulated to form an ion beam that is directed toward the workpiece.

For ease of explanation, the X direction is defined as the direction between the first end plate 202 and the second end plate 203. The Y direction is defined as the direction from one side wall 201 to the opposite side wall and as being orthogonal to the X direction and parallel to the extraction plate. The Z direction is defined as being orthogonal to the X and Y direction and perpendicular to the extraction plate. Thus, the end plates are parallel to the YZ plane.

As noted above, the absence of the repeller that is traditionally included in the arc chamber 200 may cause the second end plate 203 to be subjected to the effects of the plasma 250 within the arc chamber 200. In some embodiments, the plasma 250 may erode the second end plate 203. This erosion causes the thinning of the second end plate 203 in the X direction. In some embodiments, this erosion is not uniform across the interior surface of the second end plate 203. For example, in some embodiments, the erosion may occur in an area that is approximately the same size and shape as the cathode 210. In certain embodiments, the erosion may occur in an area that is aligned with the cathode in the Y and Z planes. In other embodiments, the erosion may not be aligned with the cathode in the Y and Z planes.

To counter this erosion, as seen in FIG. 1A, additional material is provided on the second end plate 203. FIG. 2A-2D show various implementations of the second end plate 203 that incorporate additional material to counteract the erosive behavior of the plasma. These embodiments all include a protrusion that extends from the interior surface of the second end plate 203 into the arc chamber 200 to create the non-planar second end plate. The protrusion includes a face that faces the interior of the arc chamber 200, and sidewalls that extend from the interior surface of the second end plate 203 to the face. In some embodiments, these second end plates are created using additive manufacturing such that less material is used than would be used in the production of a uniformly thicker second end plate. Thus, in some embodiments, these protrusions are integral with the second end plate 203 and are made of the same material.

Figure 2A:
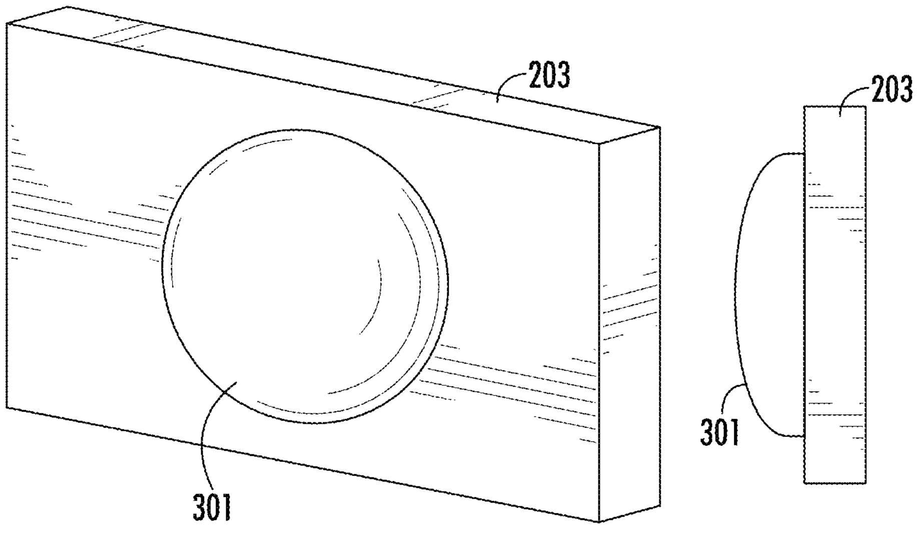
FIGS. 2A-2D show several embodiments of the second end plate that counter erosion.

In FIG. 2A, the second end plate 203 includes an inward facing protrusion in the form of a cylindrical mass 301 having a convex dome. The cylindrical mass 301 with the convex dome may extend in the X direction by between 0.125 and 0.250 inches, and may have a radius of between 0.250 and 0.600 inches. Of course, other dimensions may be used. Note that if the second end plate 203 is manufactured using additive manufacturing, the total amount of material may be about 35% less than if the second end plate was uniformly made to be the thickness achieved at the apex of the convex dome.

Figure 2B:
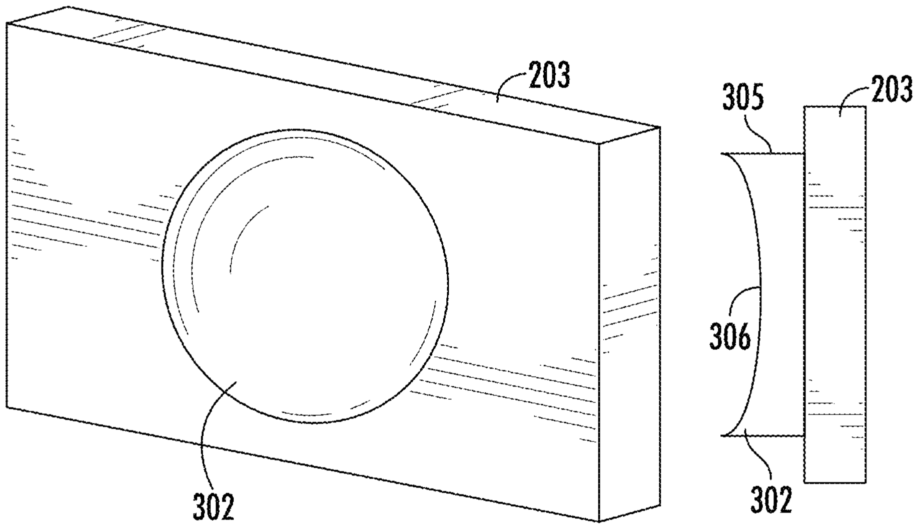

FIG. 2B shows a second embodiment of a second end plate 203. This embodiment includes an inward facing protrusion in the form of a cylindrical mass 302 having sidewalls 305 and a concave dome. The dimensions of the cylindrical mass 302 having a concave dome may be similar to those described above for the convex dome. Further, although not shown, the mass may simply be a solid cylinder extending inward toward the arc chamber 200 without a curvature on its face 306.

Further, although the cathode 210 is typically cylindrical, the inward facing protrusion may take a different shape. For example, in FIG. 2C, the inward facing protrusion is in the form of a rectangular prism 303. The dimensions of the rectangular prism 303 may vary and, in some embodiments, may be between 0.500 and 1.200 inches in the Z direction and between 0.500 and 1.200 inches in the Y direction. The sidewalls 307 of the rectangular prism 303 may be perpendicular to the surface of the second end plate 203 and may extend into the arc chamber 200 by an amount between 0.125 and 0.250 inches. In this figure, the face 308 of the rectangular prism 303 is flat. Furthermore, although not shown, in other embodiments, the face 308 of the rectangular prism 303 may be convex (see FIG. 2A) or concave (see FIG. 2B) if desired.

Figure 2C:
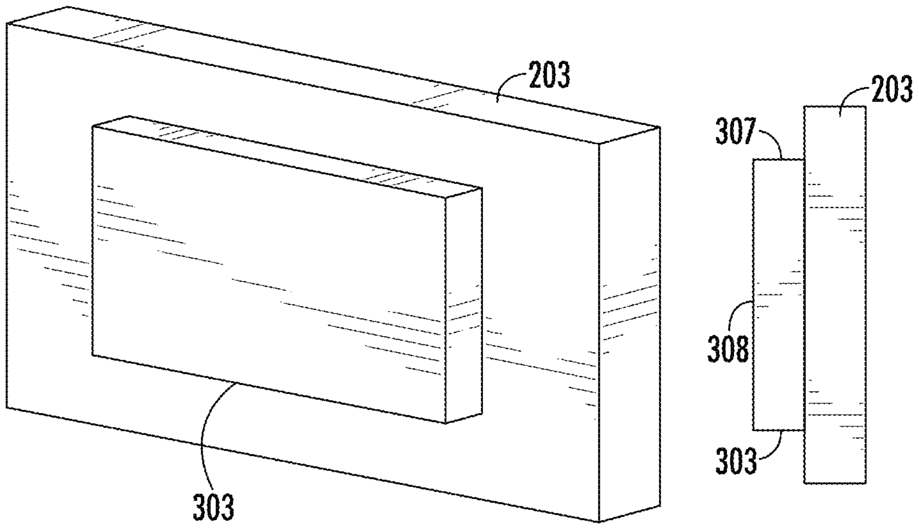
Figure 2D:
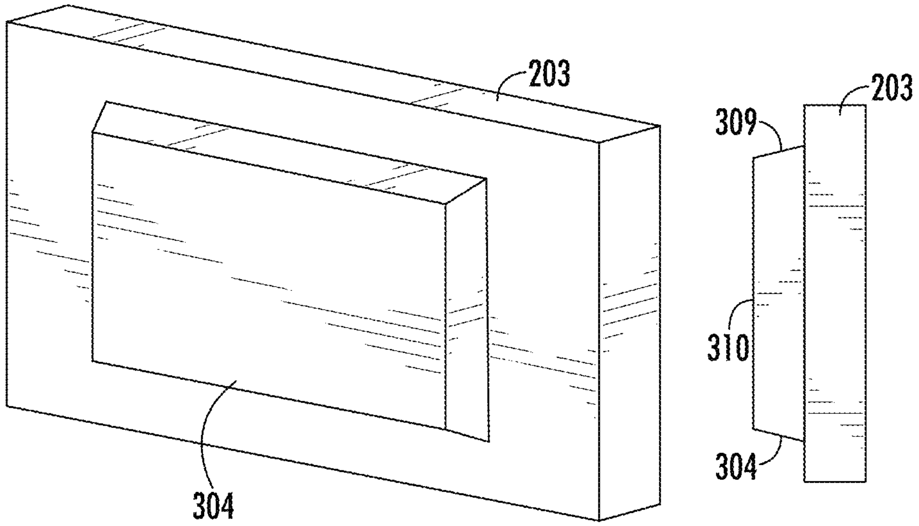

FIG. 2D shows a variation of the rectangular prism 303 of FIG. 2C. In this figure, the sidewalls 309 of the inward facing protrusion are sloped so as to form a truncated rectangular pyramid 304. The size of the face 310 may be similar to that described with respect to FIG. 2C. The angle of the slope may be implementation dependent. Further, the sloped sidewalls may also be applied to the embodiments shown in FIG. 2A-2B. Additionally, while the face 310 is shown as being flat, it may be convex or concave if desired.

Further, FIGS. 2A-2D are not meant to illustrate all possible inward protrusions. For example, the inward protrusion may be in the shape of an ellipse, a pentagon, a hexagon, an octagon, or any other suitable shape.

Thus, in some embodiments, the plasma from within the arc chamber 200 serves to erode the second end plate 203. In these embodiments, an inward facing protrusion, such as those shown in FIGS. 1A and 2A-2D, may be formed on the interior surface of the second end plate 203 to extend its lifetime. In some embodiments, the inward facing protrusion may be roughly the same size, in terms of radius and thickness, as the cathode 210. For example, the inward facing protrusion may be between 20% of the size of the cathode 210 in these dimensions. As noted above, the inward facing protrusion may be aligned with the cathode 210, such that the position of the center of the cathode 210 in the Y and Z directions is the same as the position of the center of the inward facing protrusion in the Y and Z directions. In other embodiments, the inward facing protrusion may be offset in the Y and Z directions from the cathode 210. For example, the inward facing protrusion may be offset in either or both directions by an amount that is up to 20% of the radius of the cathode 210.

Figure 1B:
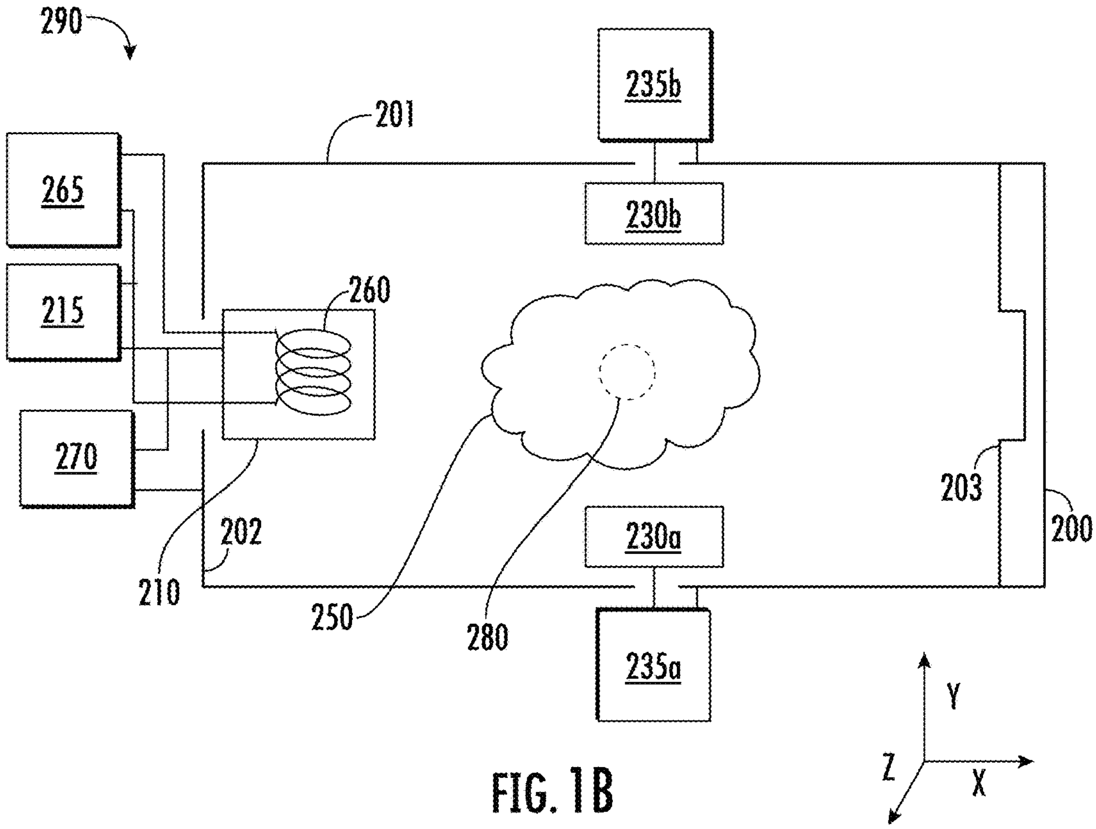

While FIG. 1A shows an inward facing protrusion, other embodiments are also possible. For examples, in other configurations, deposits may form on the second end plate 203. This deposition may grow toward the interior of the arc chamber 200, eventually affecting the operation of the ion source 290. To counteract this effect, the second end plate 203 may be constructed using an indentation on its interior surface, as shown in FIG. 1B. FIG. 1B includes all of the components described with respect to FIG. 1A and will not be described again.

FIGS. 3A-3D show various embodiments of a second end plate 203 that includes an indentation on the interior surface of the second end plate, which forms the non-planar second end plate. Note that the indentation does not extend through the entire thickness of the second end plate 203.

Figure 3A:
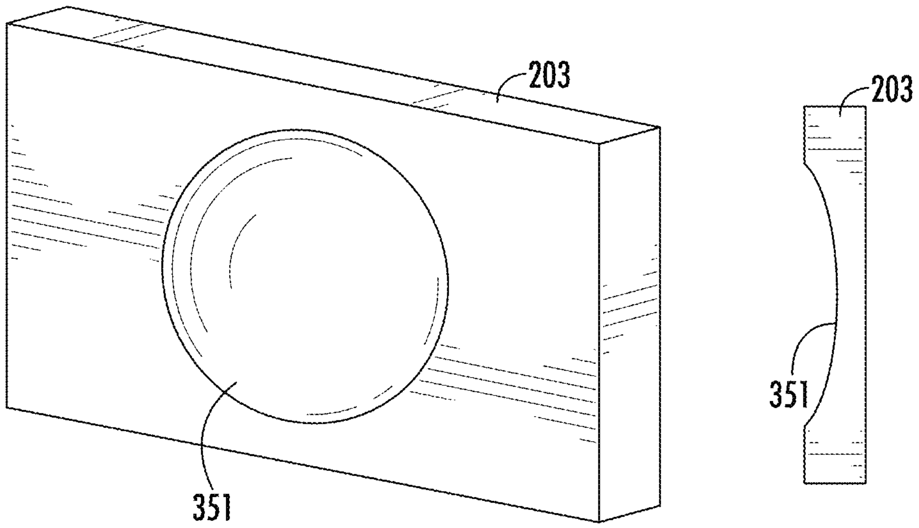
FIGS. 3A-3D show several embodiments of the second end plate that counter deposition.

In FIG. 3A, the second end plate 203 includes an inward facing indentation in the form of a cylindrical indentation 351 having a concave feature. The cylindrical indentation 351 with the concave feature may have a maximum depth along the X direction of between 0.100 and 0.200 inches, and may, in some embodiments, have a radius of between 0.250 and 0.500 inches. Of course, other dimensions are also possible. that if the second end plate 203 is manufactured using additive manufacturing, the total amount of material may be about 35% less than if the second end plate was uniformly made and then had material machined away to form the indentation.

Figure 3B:
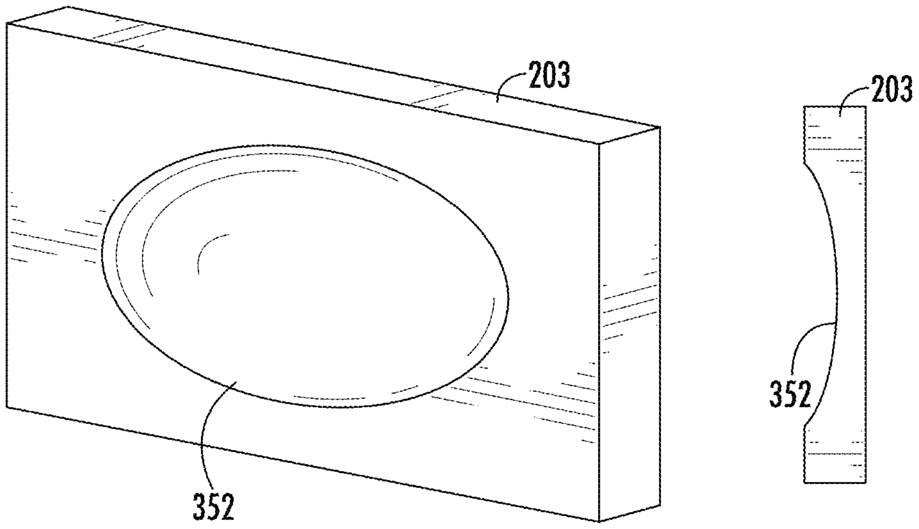

FIG. 3B shows a second end plate 203 that includes an inward facing indentation in the form of an oval indentation 352 having a concave feature. The depth of the oval indentation 352 may be similar to that described above for the cylindrical indentation and, in some embodiments, may have dimensions of between 0.250 and 0.500 inches in the Z direction and between 0.250 and 0.500 inches in the Y direction.

Figure 3C:
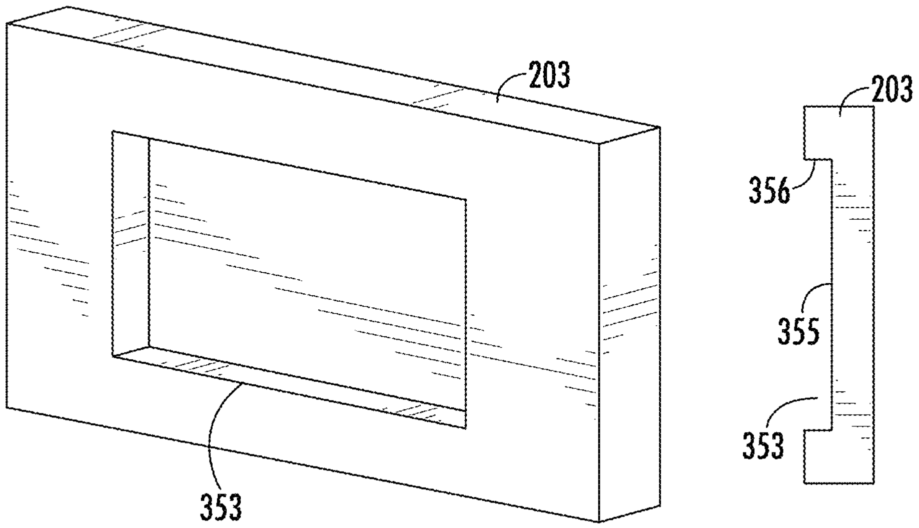

FIG. 3C shows a second end plate 203 that includes an inward facing indentation in the form of a rectangular indentation 353.

The depth of the rectangular indentation 353 may be similar to that described above for the cylindrical indentation and, in some embodiments, may have dimensions of between 0.250 and 0.500 inches in the Z direction and between 0.250 and 0.500 inches in the Y direction. Note that, in FIG. 3C, the face 355 of the indentation is flat with sidewalls 356 that are perpendicular to the face 355.

Figure 3D:
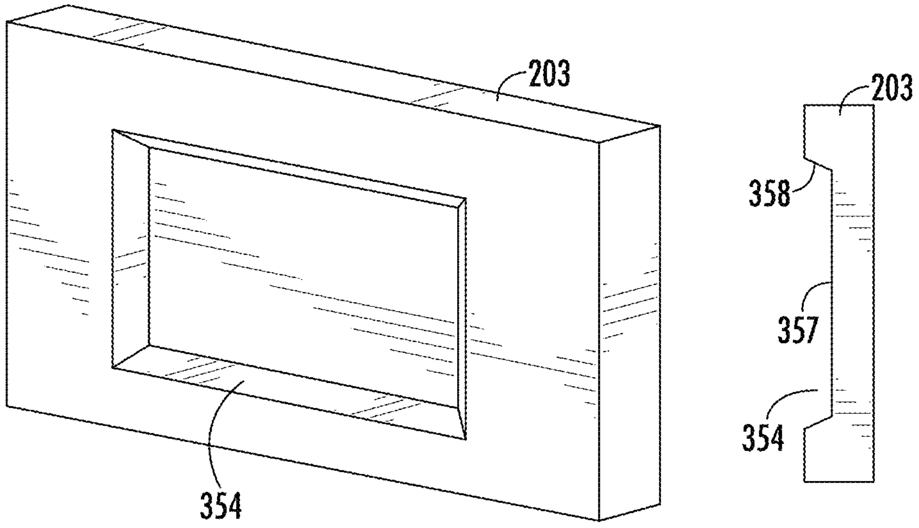

FIG. 3D also shows an inward facing indentation in the form of a rectangular indentation 354. However, in this embodiment, the sidewalls 358 of the indentation are sloped such that the dimensions of the face 357 of the indentation are smaller than at the surface of the second end plate 203. The depth and dimensions of the rectangular indentation 354 may be similar to that described above for the rectangular indentation 353.

Note that the face 355 of the rectangular indentation 353 is flat in FIG. 3C. However, it may also be concave, as shown in FIGS. 3A-3B. Further, the indentations shown in FIGS. 3A-3B may be created without concave features; rather, the face of these indentations may be flat. Additionally, the sidewalls of any of these indentations may be sloped or perpendicular.

Thus, in these embodiments, the plasma 250 from within the arc chamber 200 serves to create a deposition on the second end plate 203. In these embodiments, an inward facing indentation, such as those shown in FIGS. 1B and 3A-3D, may be formed in the second end plate 203 to extend the time before cleaning. As noted above, the inward facing indentation may be aligned with the cathode 210, such that the position of the center of the cathode 210 in the Y and Z directions is the same as the position of the center of the inward facing indentation in the Y and Z directions. In other embodiments, the inward facing indentation may be offset in the Y and Z directions from the cathode 210. For example, the inward facing indentation may be offset in either or both directions by an amount that is up to 20% of the radius of the cathode 210.

Figure 4:
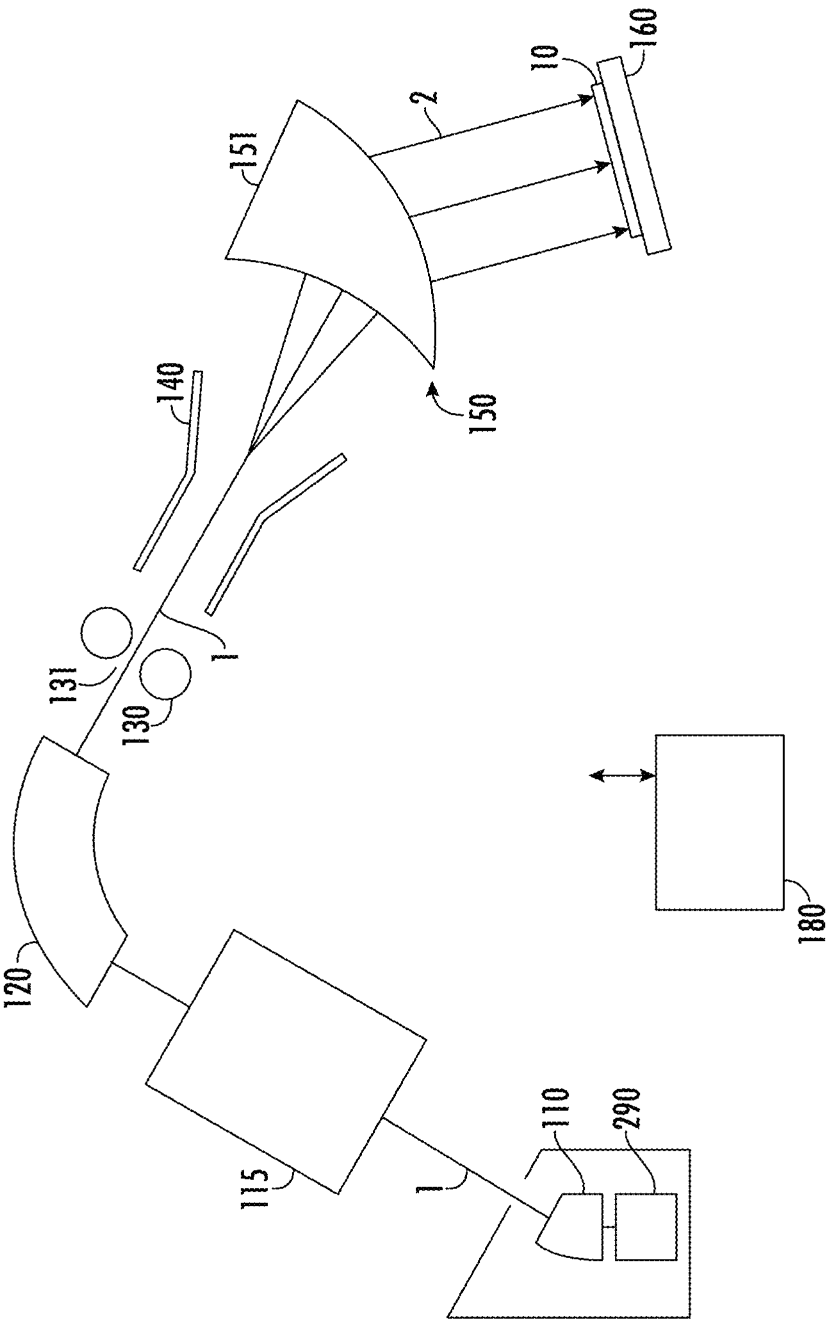
FIG. 4 shows an ion implantation system that utilizes any of the non-planar second end plates described herein.

FIG. 4 shows a beam line ion implantation system. Disposed outside and proximate the extraction aperture of the ion source 290 are extraction optics 110. In certain embodiments, the extraction optics 110 comprise one or more electrodes. Each electrode may be a single electrically conductive component with an aperture disposed therein. Alternatively, each electrode may be comprised of two electrically conductive components that are spaced apart so as to create the aperture between the two components. The electrodes may be a metal, such as tungsten, molybdenum or titanium. One or more of the electrodes may be electrically connected to ground. In certain embodiments, one or more of the electrodes may be biased using an electrode power supply. The electrode power supply may be used to bias one or more of the electrodes relative to the ion source 290 so as to attract ions through the extraction aperture. The extraction aperture and the aperture in the extraction optics 110 are aligned such that the ions 1 pass through both apertures.

Located downstream from the extraction optics 110 are one or more beam line components. The beam line components guide the ions from the ion source 290 toward the workpiece. In some embodiments, a mass analyzer 120 is located downstream from the extraction optics 110. An acceleration/deceleration column 115 may be positioned between the extraction optics 110 and mass analyzer 120. The mass analyzer 120 uses magnetic fields to guide the path of the extracted ions 1. The magnetic fields affect the flight path of ions according to their mass and charge. A mass resolving device 130 that has a resolving aperture 131 is disposed at the output, or distal end, of the mass analyzer 120. By proper selection of the magnetic fields, only those ions 1 that have a selected mass and charge will be directed through the resolving aperture 131. Other ions will strike the mass resolving device 130 or a wall of the mass analyzer 120 and will not travel any further in the system. The ions that pass through the mass resolving device 130 may form a spot beam.

The spot beam may then enter a scanner 140 which is disposed downstream from the mass resolving device 130. The scanner 140 causes the spot beam to be fanned out into a plurality of divergent beamlets. The scanner 140 may be electrostatic or magnetic. The scanner 140 may comprise spaced-apart scan plates connected to a scan generator. The scan generator applies a scan voltage waveform, such as a sawtooth waveform, for scanning the ion beam in accordance with the electric field between the scan plates. Angle corrector 150 is designed to deflect ions in the scanned ion beam to produce scanned ion beam 2 having parallel ion trajectories, thus focusing the scanned ion beam. Specifically, the angle corrector 150 is used to alter the diverging ion trajectory paths into substantially parallel paths of a scanned ion beam 2. In particular, angle corrector 150 may comprise magnetic pole pieces 151 which are spaced apart to define a gap and a magnet coil (not shown) which is coupled to a power supply. The scanned ion beam 2 passes through the gap between the magnetic pole pieces 151 and is deflected in accordance with the magnetic field in the gap. The magnetic field may be adjusted by varying the current through the magnet coil. Beam scanning and beam focusing are performed in a selected plane, such as a horizontal plane.

The workpiece 10 is disposed on a movable workpiece holder 160. In certain embodiments, the forward direction of the scanned ion beam 2 is referred to as the Z-direction, the direction perpendicular to this direction and horizontal may be referred to as the X-direction, while the direction perpendicular to the Z-direction and vertical may be referred to as the Y-direction. In this example, it is assumed that the scanner 140 scans the spot beam in the X-direction while the movable workpiece holder 160 is translated in the Y-direction. The rate at which the scanner 140 scans the spot beam in the X-direction may be referred to as beam scan speed or simply scan speed.

Thus, in operation, the movable workpiece holder 160 moves in the Y direction from a first position, which may be above the scanned ion beam 2 to a second position, which may be below the scanned ion beam 2. The movable workpiece holder 160 then moves from the second position back to the first position. During this time, the spot beam is being scanned in the X direction, ensuring that the entirety of the workpiece 10 is exposed to the spot beam.

There are one or more beamline components that serve to direct the ion beam from the ion source 290 to the movable workpiece holder 160. While FIG. 4 shows an ion implantation system that utilizes a spot beam, it is understood that the ion source 290 may be used to generate a ribbon ion beam. In this embodiment, the scanner 140 is no longer utilized.

A controller 180 is also used to control the system. The controller 180 has a processing unit and an associated memory device. This memory device contains the instructions, which, when executed by the processing unit, enable the system to perform the functions described herein. This memory device may be any non-transitory storage medium, including a non-volatile memory, such as a FLASH ROM, an electrically erasable ROM or other suitable devices. In other embodiments, the memory device may be a volatile memory, such as a RAM or DRAM. In certain embodiments, the controller 180 may be a general purpose computer, an embedded processor, or a specially designed microcontroller. The actual implementation of the controller 180 is not limited by this disclosure.

The system described herein has many advantages. As noted above, in ion sources that lack a repeller, the second end plate is susceptible to the effects of the plasma. In certain embodiments, the plasma serves to erode the second end plate. By incorporating an inward facing protrusion on the interior surface of the second end plate, the lifetime of the second end plate may be extended. Additionally, if the second end plate is produced using additive manufacturing, the amount of material used to create the second end plate is reduced, when compared to utilizing a uniformly thicker second end plate. Further, in other embodiments, the plasma may cause deposition to form on the second end plate. By creating an indentation in the second end plate, this deposition may grow without affecting the operation of the ion source.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
- an arc chamber having a first end plate, a second end plate and side walls connecting the first end plate and the second end plate;
- a cathode disposed within the arc chamber near the first end plate; and
- an extraction plate disposed on the arc chamber, wherein the second end plate comprises an inward facing protrusion.

2. The ion source of claim 1, wherein the arc chamber comprises one or more side electrodes, disposed near the side walls.

3. The ion source of claim 1, wherein the inward facing protrusion is aligned with the cathode.

4. The ion source of claim 1, wherein the inward facing protrusion has a cylindrical shape.

5. The ion source of claim 1, wherein the inward facing protrusion comprises a rectangular prism.

6. The ion source of claim 1, wherein the inward facing protrusion comprises a face and sidewalls.

7. The ion source of claim 6, wherein the face of the inward facing protrusion is flat, concave or convex.

8. The ion source of claim 6, wherein the sidewalls are perpendicular to an inner surface of the second end plate.

9. An ion implantation system comprising:
- the ion source of claim 1 to generate an ion beam;
- a workpiece holder; and
- one or more beam line components to direct the ion beam toward the workpiece holder.

10. An ion source, comprising:
- an arc chamber having a first end plate, a second end plate and side walls connecting the first end plate and the second end plate;
- a cathode disposed within the arc chamber near the first end plate; and
- an extraction plate disposed on the arc chamber, wherein the second end plate comprises an inward facing indentation.

11. The ion source of claim 10, wherein the arc chamber comprises one or more side electrodes, disposed near the side walls.

12. The ion source of claim 10, wherein the inward facing indentation is aligned with the cathode.

13. The ion source of claim 10, wherein the inward facing indentation has a cylindrical shape.

14. The ion source of claim 10, wherein the inward facing indentation is oval.

15. The ion source of claim 10, wherein the inward facing indentation is rectangular.

16. The ion source of claim 10, wherein the inward facing indentation has a face and sidewalls.

17. The ion source of claim 16, wherein the face of the inward facing indentation is flat, concave or convex.

18. The ion source of claim 16, wherein the sidewalls are perpendicular to an inner surface of the second end plate.

19. An ion implantation system comprising:

the ion source of claim 10 to generate an ion beam;

a workpiece holder; and one or more beam line components to direct the ion beam toward the workpiece holder.

* * * * *